(12) United States Patent
Violette et al.

(10) Patent No.: US 6,326,281 B1
(45) Date of Patent: Dec. 4, 2001

(54) INTEGRATED CIRCUIT ISOLATION

(75) Inventors: Katherine E. Violette, Dallas; Rick L. Wise, Fairview; Stanton P. Ashburn, McKinney; Mahalingam Nandakumar, Plano; Douglas T. Grider, McKinney, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/405,278

(22) Filed: Sep. 23, 1999

Related U.S. Application Data
(60) Provisional application No. 60/101,455, filed on Sep. 23, 1998.

(51) Int. Cl.[7] .................................................... H01L 21/36
(52) U.S. Cl. ............................................................ 438/413
(58) Field of Search ..................................... 438/492, 413

(56) References Cited

U.S. PATENT DOCUMENTS

| | | | |
|---|---|---|---|
| 4,111,724 | * | 9/1978 | Ogiue et al. ........................ 438/363 |
| 4,283,837 | * | 8/1981 | Slob ..................................... 438/372 |

* cited by examiner

*Primary Examiner*—Richard Elms
*Assistant Examiner*—Beth E. Owens
(74) *Attorney, Agent, or Firm*—Carlton H. Hoel; W. James Brady; Frederick J. Telecky, Jr.

(57) ABSTRACT

Silicon substrate isolation by epitaxial growth of silicon through windows in a mask made of silicon nitride (202) on silicon oxide (201) with the silicon oxide etched to undercut the silicon nitride; the mask is on a silicon substrate.

3 Claims, 2 Drawing Sheets ically grown isolation structures and fabrication methods
INTEGRATED CIRCUIT ISOLATION

RELATED APPLICATIONS

This application claims benefit of Prov. No. 60/101,455 filed Sep. 23, 1998.

The following patent application discloses related subject matter: Ser. No. 09/205,388, filed Dec. 4, 1998. This application has a common assignee with the present application.

BACKGROUND OF THE INVENTION

The invention relates to electronic semiconductor devices, and, more particularly, to integrated circuits with selectively grown silicon isolation structures and fabrication methods for such structures.

The advancement of the silicon microelectronic technology towards higher operating frequencies and higher packing densities leads to the application of more complex manufacturing technologies. Epitaxial growth is used to obtain sharper doping transitions between very thin layers as a replacement for ion implantation. For selective epitaxial growth (SEG) of silicon the Si epitaxial deposition is confined to openings in masking layers formed by oxidizing the Si surface or by chemical vapor deposition (CVD) of masking films like silicon nitride. Windows in the masking layer are defined by photolithography and etching.

The challenge in SEG is to develop processes for the mask formation, the Si surface preparation, and the epitaxial growth which maintain the advantages of doping control and eliminate deleterious effects caused by the mask sidewalls, such as defects near the sidewalls and faceted growth. J. O. Borland et al. (Solid State Technology, August 1985) reviewed dielectric isolation technologies and pointed out that SEG offers improvements for submicrometer CMOS devices. V. Silvestri et al. in U.S. Pat. Nos. 4,526,631 and 4,689,656 disclose how SEG, based on specific processes, can be applied to the formation of void-free isolation patterns by filling deep silicon trenches when the growth is confined to the bottom of the mask window. To achieve the required wafer flatness a thick $SiO_2$ layer had to be deposited and then planarized by chemical mechanical polishing (CMP). Liaw et al. in U.S. Pat. No. 4,786,615 disclose improved planarity of epitaxial surfaces obtained by growing two superimposed epitaxial layers at temperatures above and below a transition temperature, Tt, in this case, approximately 975° C. Above Tt, the growth rate is "mass transport limited"; i.e., the silicon source species has to diffuse through a boundary layer on the seed surface. The thickness of the boundary layer is influenced by the surface topology and by the gas flow and pressure conditions. Below Tt the growth rate is controlled by the reaction rate of surface processes which involve the movement of adsorbed silicon from the landing site to the place where the Si is incorporated into the crystal; e.g., at surface ledges and kinks. Below Tt, in the kinetically controlled regime, the growth rate depends strongly on the surface orientation of the seed and the growth of facets was observed. Flat surfaces were obtained by growing first at T<Tt, followed by growth at T>Tt. A thinner boundary layer at the mask edges caused a higher growth rate adding material in areas which earlier had a reduced thickness due to facet growth.

T. O. Sedgwick et al. (J.Electrochem.Soc. October 1991) showed that oxygen background reduction extends the Si epitaxial growth temperature to as low as 600° C. Under this growth condition the area next to the <110> oriented mask sidewall is heavily twinned and thicker than the remaining epitaxial layer. A. Ishitani et al. (Jap.J.Appl.Phys. May 1989) studied the development of <311> oriented facets, using a single layer growth mask. In <100> oriented square windows <311> facets developed only in the rounded mask corners. This mask sidewall orientation also led to stacking-fault-free silicon layers when grown at low temperature, in this system 950° C.

More recently, J. M. Sherman et al. (IEEE Elec. Device Letters, June 1996), report studies of selective Si growth and the achievement of a reduction, but not complete elimination, of growth mask sidewall effects.

Summarizing prior art of Si SEG, deleterious effects of the mask sidewalls on the epilayer morphology and on electrical characteristics were reduced, but not eliminated, by optimizing the wafer surface preparation and growth parameters such as temperature, pressure, gas composition (HCl concentration), and by restricting the mask sidewall alignment to the <100> orientation.

SUMMARY OF THE INVENTION

The present invention provides silicon isolation structures analogous to shallow trench isolation (STI) by epitaxial growth of silicon in openings in a silicon-nitride-on-silicon-oxide mask on a silicon substrate with an initial etch of the oxide to undercut the nitride yielding facet-free silicon epitaxy.

This has advantages including a nitride isolation surface to eliminate insulator loss during wet etching and surface preparation.

BRIEF DESCRIPTION OF THE DRAWINGS

The drawings are heuristic for clarity.

DESCRIPTION OF THE PREFERRED EMBODIMENTS

Overview

The preferred embodiments create a silicon substrate with planar isolation dielectric made of silicon nitride on silicon oxide by epitaxially growing the silicon in openings in the isolation. The growth uses a gas mixture of dichlorosilane (DCS)+hydrogen chloride+hydrogen. Facet-free growth results from using an etch of the underlying oxide to undercut the nitride plus growing conditions of relatively high pressure (about 40 Torr or more) and relatively high ratio of DCS to HCl (about 3 to 2).

The resulting isolated silicon substrate has only exposed nitride isolation which eliminates insulator loss during wet etching and surface preparation. Further, the vertical nitride sidewall permits isolation vertical thickness adjustment without changing trench fill capability (contrary to STI) and reduces peripheral junction capacitance of devices formed in the grown silicon. Also, the grown silicon leads to simpler planarization, for example, by CMP.

First preferred embodiment

To understand the preferred embodiments, first consider the two categories of selective epitaxial silicon growth defects common in the prior art.

Figure 1A:
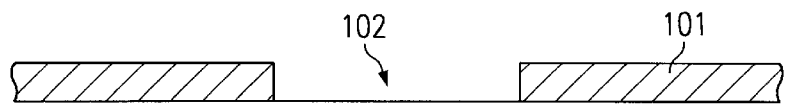
FIGS. 1-A to 1-C schematically depict cross-sectional views of known selectively grown epilayers.

FIG. 1A depicts in schematic cross-sectional elevation view a <100> oriented Si wafer 100, coated with a masking layer 101, which could consist of $SiO_2$, produced by an oxidation process or by CVD deposition, e.g., from TEOS, or it could consist of a nitride. A $SiO_2$ layer could also be nitrided in a separate process. A window 102 has been formed by photolithography and etching. Prior to selective epitaxial growth the exposed Si surface is typically prepared by etching and baking.

Figure 1B:
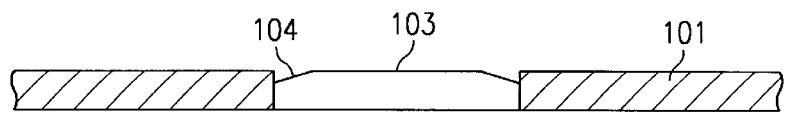
Figure 1C:
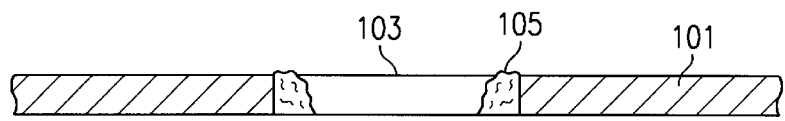

FIGS. 1-B and 1-C show in schematic cross-sectional elevation views the situation after growth of epitaxial layer 103. Two critical areas are facet growth 104 and thicker, heavily-twinned growth 105 near the mask sidewall. Such defects have prevented acceptance of selective epitaxial growth as a standard process step for advanced transistor structures.

Figure 2A:
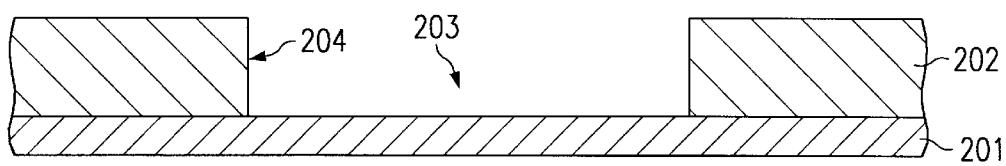
FIGS. 2-A to 2-C schematically depict cross-sectional views of a selectively grown isolated epitaxial structure at various process steps according to a preferred embodiment.
Figure 2B:
Figure 2C:
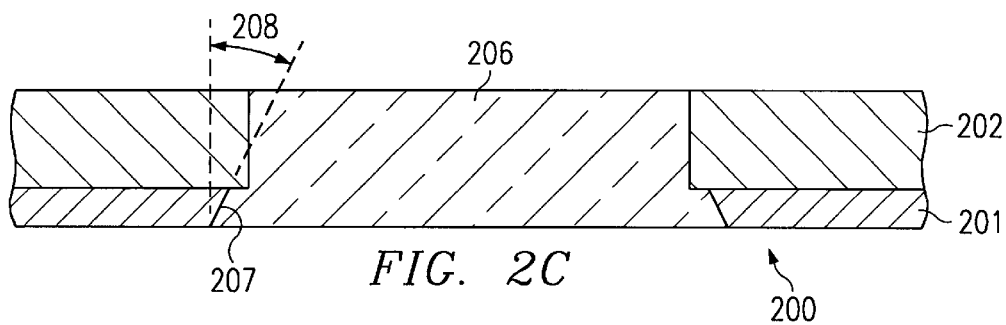

FIGS. 2A –2C illustrate the first preferred embodiment.

FIG. 2-A shows in schematic cross-sectional elevation view a Si wafer 200 with a stacked growth window structure, a $SiO_2$ layer 201, and $Si_3N_4$ layer 202. Layer 201 is a thermal oxide, 15 to 30 nm thick, and layer 202 is nitride deposited by thermal CVD using $NH_3$/dichlorosilane chemistry to a thickness of 200 nm. The window 203 in the $Si_3N_4$ layer 202 is formed by photolithography and anisotropic plasma etching, using the $SiO_2$ layer 201 as an etch stop. It is critical to achieve and maintain vertical sidewalls for layer 202 for facet-free selective growth.

FIG. 2-B shows in schematic cross-sectional elevation view after $SiO_2$ layer 201 has been opened by a wet etch in 0.49% HF in deionized (DI) water. This leaves a semi-circular etched region 205 beneath the nitride sidewall 204 extending into the oxide layer 201.

FIG. 2-C schematically depicts in cross-sectional elevation view a facet-free isolated epitaxial structure 206 grown according to this preferred embodiment. The epitaxial deposition is preceded by a pre-growth $H_2$ bake. Such a bake is commonly the last step of the Si surface preparation, performed in the epitaxy reactor before the start of the growth cycle. The bake conditions are optimized to obtain a clean interface and good single-crystalline growth for a particular epitaxy reactor, while minimizing changes to other areas of the wafer. The pre-growth bake conditions were 900° C. for 60 seconds.

Experiments show that facet-free growth requires sidewall 204 of the nitride layer 202 to be vertical and the sidewall 207 of oxide layer 201 to have an angle of approximately 45 degrees (angle 208 in FIG. 2-C) when analyzed after growth. Scanning transmission electron microscopy can provide the sidewall angle analysis. The angle 208 has to be obtained during the beginning phase of the epitaxial growth or during the pre-growth bake.

The choice of $SiO_2$ for layer 201 takes advantage of a reaction occurring between the $SiO_2$ and Si, stemming either from dichlorosilane or from the Si wafer surface, leading to the formation of silicon monoxide (SiO). The evaporation of SiO, which is a loss of silicon and oxygen, causes the desired change of the sidewall angle.

Table 1 presents a matrix of growth experiments using gas mixtures of dichlorosilane (DCS)+hydrogen chloride (HCl)+hydrogen ($H_2$) in a single-wafer, radiantly-heated reactor system. The experimental conditions 5,6, and 7 encompass the process window which yields layers with no facets. The process window is centered around the following conditions:

T=850° C., p=40 Torr, DCS flow of 200 sccm, HCl flow of 130 sccm, $H_2$ flow of 20 slm (20,000 sccm). The absence of facets was always observed to coincide with production of sidewall angles, as shown in FIG. 2-C. With the windows 203 filled with epitaxial silicon 206 of desired doping concentration, and the windows isolated from other by walls of dielectric material 201 and 202, the silicon wafer can be processed by standard methods to manufacture silicon devices.

TABLE 1

Growth Parameters and Results

| Exper. # | Pressure [Torr] | DCS/HCl Ratio | Temp [° C.] | Thickness [nm] | Facets |
|---|---|---|---|---|---|
| 1 | 10 | 1:1 | 825 | 13.2 | no* |
| 2 | 10 | 1:1 | 875 | 52.7 | yes* |
| 3 | 10 | 2:1 | 825 | 36.0 | no/yes |
| 4 | 10 | 2:1 | 875 | 88.4 | yes |
| 5 | 40 | 3:2 | 850 | 52.3 | no |
| 6 | 70 | 1:1 | 825 | 15.9 | no |
| 7 | 70 | 1:1 | 875 | 86.5 | no |
| 8 | 70 | 2:1 | 825 | 45.6 | no/yes* |

Epitaxy reactor: single wafer system, radiantly heated
Gas flows: $H_2$: 20 slm; DCS: 200 sccm
Growth time: 1 min.
Yes: facets are present
No: no facets present
*indicates the average result from several duplications The foregoing Table 1 shows that a DCS to HCl ratio of 2 to 1 at best yields a marginal epitaxy; whereas, for a ratio of 1 to 1 only the high temperature (875° C.) plus low pressure (10 Torr) condition does not yield good results.

In effect the acute angle of the sidewall of the oxide bottom portion of the window prevents lateral overgrowth during initial phase of epitaxy, and process conditions provide high silicon coverage with little surface mobility thus growth occurs evenly over all exposed silicon surfaces maintaining initial silicon morphology. Also, the nitride sidewalls are roughly vertical which further constrains growth to vertical orientation.

After the growth to fill the windows with silicon, clean up and planarize, for example, by CMP.

Preferred embodiment devices

Figure 3:
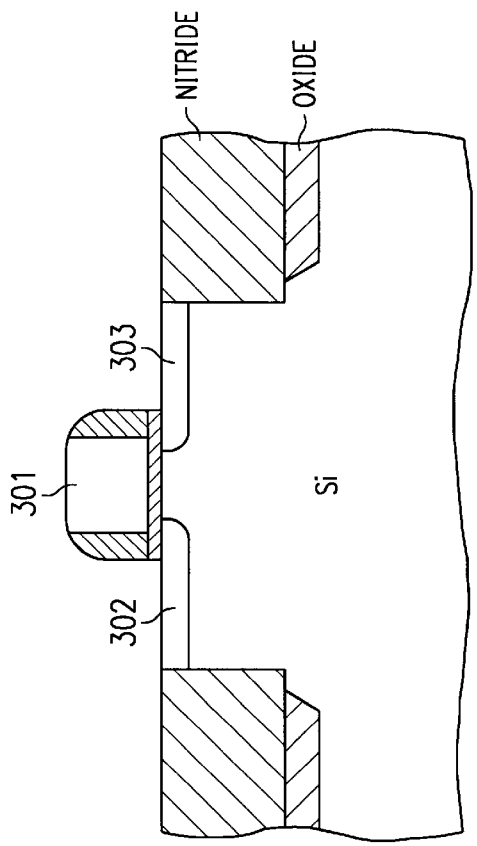
FIG. 3 schematically depicts a MOSFET fabricated on the epitaxially grown isolated silicon.

FIG. 3 depicts a preferred embodiment application of the selective epitaxial growth process for isolation with fabrication of a MOS transistor on the resulting isolated silicon. The gate 301 can consist of polysilicon or metal such as tungsten on TiN. Source and drain regions 302 and 303 can be fabricated by ion implantation self-aligned to the gate with sidewall spacers.

Figure 4:
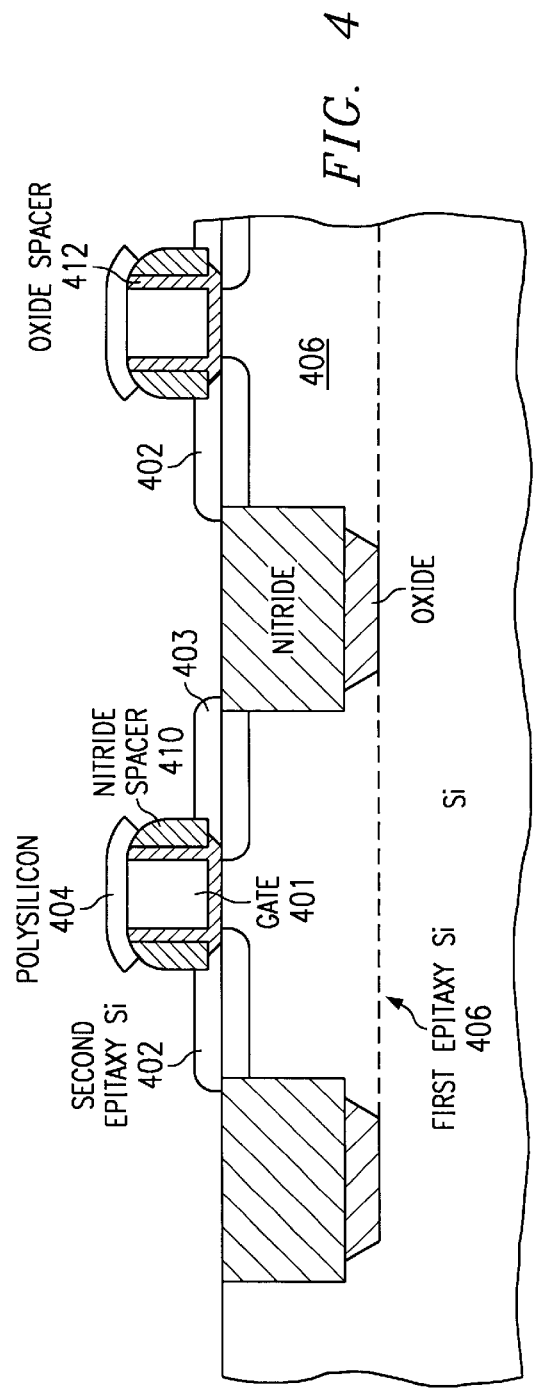
FIG. 4 shows MOSFETs with raised source/drains on epitaxially grown isolated silicon.

FIG. 4 shows a preferred embodiment with isolation and MOS transistors which has a first selective epitaxial growth 406 for the isolated silicon plus a second selective epitaxial growth for thickened (raised) sources and drains 402 and 403. Raised source/drains lowers electrical resistance. Localized epitaxial layers for the raised source/drain were selectively deposited using gate sidewall spacer layers of nitride 410 on oxide 412 as part of the growth mask structure with the oxide being etched to undercut the nitride sidewall spacer for the epitaxy in the same manner as with the isolation bottom oxide. The growth conditions for both of the epitaxies are about the same. Note that polysilicon 404 grows on the top of polysilicon gate 401 during the second epitaxy.

Modifications

The preferred embodiments can be modified in various ways while retaining the features of isolation grown by epitaxy with a undercut nitride over oxide mask. For example, the temperature, pressure, and gas mixture can be modified provided that the DCS to HCl ratio remains below 2 to 1 and the high temperature plus low pressure region of 875° C. plus 10 Torr is avoided.

What is claimed is:

1. A method of fabrication of an isolated silicon structure, comprising the steps of:

(a) providing a mask with windows on a silicon substrate, said mask with a top silicon nitride layer and a bottom silicon oxide layer wherein the silicon oxide layer is etched to undercut the silicon nitride layer; and (b) growing silicon in said windows from a gas mixture of dichlorosilane, hydrogen chloride, and hydrogen wherein the ratio of dichlorosilane to hydrogen chloride is less than 2 to 1.

2. The method of claim 1, wherein the growing of step (b) of claim 1 has a temperature less than 875° C.

3. The method of claim 1, wherein the growing of step (b) of claim 1 has a pressure more than 10 Torr.

* * * * *